US008111100B1

(12) United States Patent
Pease

(10) Patent No.: US 8,111,100 B1
(45) Date of Patent: Feb. 7, 2012

(54) DIFFERENTIAL AMPLIFIER WITH IMPROVED ZERO-POINT CALIBRATION

(75) Inventor: Robert Allen Pease, San Francisco, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/780,208

(22) Filed: May 14, 2010

(51) Int. Cl.
*H03F 3/45* (2006.01)
(52) U.S. Cl. .......................................... 330/69; 330/260
(58) Field of Classification Search ................ 330/2, 69, 330/86, 252, 260
See application file for complete search history.

(56) References Cited

U.S. PATENT DOCUMENTS 6,515,542 B1 * 2/2003 Wang et al. ..................... 330/69
7,863,977 B1 * 1/2011 Xiang et al. .................... 330/69
* cited by examiner

*Primary Examiner* — Khanh Nguyen

(57) ABSTRACT

The present invention covers novel approaches to the differential amplification of an input signal. Embodiments of the present invention have precise gain, swing to within microvolts (μV) of ground, and have high CMRR without the need for precision resistors or tuned potentiometers. Embodiments of the present invention are particularly suited for the amplification of an instrumentation signal for delivery to an analog-to-digital converter. Examples of such signals include the product of a strain-gauge front end, a temperature sensor front end, and certain devices for bioelectronics detection. Embodiments of the present invention which are systems for amplification of a differential input signal can comprise a differential input stage transconducing a differential voltage input signal into a single-ended intermediate current signal using a follower transconductance amplifier, and a single-ended output stage comprising an amplifier producing an output voltage across a resistor network that forms a negative feedback network of the amplifier.

19 Claims, 5 Drawing Sheets

DIFFERENTIAL AMPLIFIER WITH IMPROVED ZERO-POINT CALIBRATION

FIELD OF THE INVENTION

The invention relates generally to amplifier circuits and systems, and more specifically to differential amplifiers circuits.

BACKGROUND OF THE INVENTION

Amplifiers are systems that increase the power of a signal. An electronic amplifier takes power from a power supply and shapes its output to match the input signal. The first electronic amplifiers were used in communication systems. One of the earliest examples of such a circuit is the Audion described in U.S. Pat. No. 841,386 to De Forest. Today, amplifiers are an indispensible portion of nearly all analog and mixed-signal electronic systems. Amplifiers have myriad uses including increasing the power of a communication signal for transmission through a wireless network, adjusting the strength of an audio signal to a desired volume, and making a sensor signal more readily convertible to a digital format.

In electronic circuit design, a differential architecture is one in which the carried signal is defined by the difference in potential between two nodes that have equal and opposite excursions from a fixed potential. The fixed potential voltage is called the common mode voltage. For example, two children on a rigid see-saw are at any moment an equal and opposite distance from the fulcrum of the see-saw. When they are even with the fulcrum, the differential signal they represent is zero. When the children are at a maximum distance from the fulcrum they are an equal distance away in opposite directions, and the differential signal they represent is at a maximum. A differential architecture can be contrasted with a typical single-ended circuit wherein the signal is defined by the difference in voltage between a single signal node and a fixed potential. Using the same example, at any moment the distance from a single child's center of gravity to the ground represents a single-ended signal.

In today's high-performance analog and mixed-signal circuits, the dominant architecture for amplifier circuits is differential. The first differential amplifier was described in U.K. Pat. No. 482,470 to Blumlein. Differential architectures are favored because they are inherently resistant to noise. As described above, a differential signal is defined as the difference between the potentials on two nodes. Since both nodes are likely affected by noise to the same degree, the operation of subtracting the voltage on one node from the voltage on the other will effectively subtract out the noise from the signals. Returning to the see-saw example, noise in the circuit could be analogized to an earthquake striking the park where the see-saw was located. The difference between the positions of the two children would be unaffected by the rolling of the earth because each would be rising and falling with the fulcrum in tandem. However, the height of a single child would be disturbed from the norm because the fulcrum of the see-saw and the ground directly beneath the child could be at different elevations due to the wave-like movement of the ground during the earthquake.

There are numerous variations between a real world amplifier and its ideal. These variations have been studied and categorized extensively over the past century. Three key aspects of a differential amplifier's performance that vary from the ideal are the amplifier's output swing, common mode rejection ratio (CMRR), and gain. The gain of an amplifier is the factor by which the power of the input signal is increased by the amplifier. This value should remain constant despite the varying common mode level of the input signal and other variations in the amplifier's operating conditions. For a differential amplifier, the gain value is usually represented by the symbol $A_{DM}$. The output swing of the amplifier is the span of voltages or currents the amplifier is able to produce at its output without degrading the signal. The CMRR of an amplifier is a measure of how well the amplifier ignores the common mode voltage of the input signal while amplifying the difference between the two components of the input signal.

Description of an amplifier's CMRR requires that a distinction be made between differential gain $A_{DM}$, and common mode gain $A_{CM}$. An ideal differential amplifier will produce an output signal that is completely free of the influence of that portion of the input signals which is common to both of the input signals. No amplifier is completely ideal, so each will produce an output signal that is equivalent to the common mode of the input signal multiplied by the common mode gain of the amplifier. An ideal differential amplifier that outputs a single-ended signal has a common mode gain of zero. The CMRR of a differential amplifier is proportional to the logarithm of $A_{DM}$ divided by $A_{CM}$. Since undesired common mode gain will result in a portion of the output signal being erroneous, and the overall size of the output signal is set by the differential gain, the CMRR is a representation of the degree to which the common mode gain corrupts the output signal. An ideal differential amplifier that outputs a single-ended signal will have a CMRR of infinity.

The circuit illustrated in FIG. 1 belongs to a class of differential amplifiers known as instrumentation amplifiers. This particular configuration uses three operational amplifiers, and has been used and studied extensively in the prior art. The instrumentation amplifier in FIG. 1 takes in the components of a differential signal on the nodes V− and V+. The illustrated circuit is a single-ended differential amplifier because the amplified output signal is provided in single-ended format on node $V_{OUT}$. The circuit is commonly used in measurement and test equipment because it has extremely high input impedance. In other words, amplifier 101 and amplifier 102 draw extremely low currents from nodes V− and V+ respectively which allows the circuit to sample very delicate signals without disturbing them. The circuit also has high gain as discussed below.

The gain of the instrumentation amplifier in FIG. 1 is best understood by analyzing the circuit in two stages. The first stage of the amplifier is comprised of amplifier 101, amplifier 102, and resistors 103, 104, and 105. In an ideal circuit, resistor 104 and 105 are equivalent. Without resistor 103, the remaining components would act as unity-gain buffers. However, with the addition of resistor 103, the gain of the input stage increases considerably. The ideal differential gain of the first stage is:

$$A_{DM1} = 1 + (2 \times R_{104})/R_{103}$$

In the previous equation, $A_{DM1}$ is the differential gain of the first stage, and the R values are the resistance values of resistors 103, and 104 as indicated by their subscripts. The second stage of the amplifier in FIG. 1 is comprised of amplifier 106, and resistors 107, 108, 109 and 110. Resistors 107 and 108 are equivalent in an ideal circuit. Resistors 109 and 110 are also equivalent in an ideal circuit. The ideal differential gain of the second stage is:

$$A_{DM2} = -R_{109}/R_{107}$$

In the previous equation, $A_{DM2}$ is the differential gain of the second stage, and the R values are the resistance values of resistors 109, and 107 as indicated by their subscripts. The overall gain of the amplifier is the product of the gains of the individual stages. This overall gain value describes the ratio of the differential signal at the input of the amplifier to the single-ended signal at the output of the amplifier.

The CMRR of the circuit in FIG. 1 has been studied extensively because rejection of common mode noise is one of the key advantages of this circuit. If all of the resistors and amplifiers in FIG. 1 are ideal, the common mode gain of the circuit is zero. In this case, the single-ended output voltage is precisely equal to the difference between the input voltages multiplied by the differential gain derived above. However, if the resistors do not match, or the CMRRs of amplifiers 101, 102, and 106 are less than infinity, the common mode gain of the circuit will be greater than zero, and the CMRR of the circuit will not be infinite.

Typical amplifiers used for amplifiers 101, 102, and 106 have extremely high CMRRs in the range of 130 to 140 decibels (dB) thereby allowing a simplified analysis which considers the amplifiers to be ideal. As such, the first stage in its entirety will have very little effect on the CMRR of the overall circuit. However, the same cannot be said for the resistors in the second stage. If resistor 109 does not match resistor 110, or if resistor 107 does not match resistor 108, the CMRR of the circuit can be seriously affected. With the above mentioned simplification for ideal amplifiers, the common mode gain of the circuit in FIG. 1 can be expressed as:

$$A_{CM}=[(R_{109}+R_{107}) \times R_{110}-(R_{110}-R_{108}) \times R_{109}]/[(R_{110}+R_{108}) \times R_{107}]$$

In the previous equation, $A_{CM}$ is the common mode gain of the system, and the R values are the resistance values of resistors 107, 108, 109, and 110 as indicated by their subscripts. If the pertinent resistors in the above equation are perfectly matched, the common mode gain of the circuit would drop to zero.

The common mode gain equation above for the circuit in FIG. 1 can be used to test the sensitivity of the CMRR of the circuit to variations in resistor values. In a circuit where resistor 109 and resistor 110 are designed to be 100 kilohms (kΩ), and resistor 108 and 107 are designed to be 1 kΩ, but resistor 109 is larger by 1%, the $A_{CM}$ of the circuit would be roughly 0.01. In this case, the output signal would have roughly 20 millivolts (mV) of common mode output voltage for every 2 volts (V) of common mode input. It is for this reason that real world applications of this circuit require either highly accurate resistors, or adjustable resistors that are trimmed once the circuit is fabricated. Although this can improve the CMRR of the circuit, both approaches are very expensive. Therefore, the CMRR of the circuit in FIG. 1 is the cause of some concern.

The output swing of the circuit in FIG. 1 is also problematic. Implementations of the circuit in FIG. 1 often use what is called a rail-to-rail amplifier for amplifier 106. These designs suffer from the fact that rail-to-rail amplifiers are generally unable to truly swing from the supply rail to the ground rail. The output of these amplifiers might not be able to swing down below 25 mV. As a result, a portion of the information contained in the input signal is lost as the amplifier "clips" off what should ideally be an output signal below the minimum output voltage of amplifier 106.

SUMMARY OF INVENTION

In one embodiment of the invention, a system for amplification of a differential input signal is disclosed. The system comprises a first resistor coupled as a portion of a circuit branch from a first virtual short to a second virtual short, where the first and second virtual shorts are driven respectively by a first and a second amplifier configured for negative feedback. The system also comprises a three-terminal device having a first terminal coupled to the first resistor, a second terminal coupled to an output of the second amplifier, and a high impedance output terminal passing a current substantially controlled by a difference in potential between the first and second terminals. The system also comprises a third amplifier having a positive input coupled to a first bias voltage through a second resistor, a negative input coupled to the first bias voltage through a third resistor, and an output node. The system also comprises a fourth resistor coupled as a portion of a negative feedback path for the third amplifier. In this system, the differential input signal is differentially applied to a first input of the first amplifier and a second input of the second amplifier, and the high impedance output terminal is coupled to the positive input of the third amplifier.

DETAILED DESCRIPTION OF THE PREFERRED EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Specific examples of these concepts include how resistors in block diagrams represent any form of resistive element including potentiometers, and how diagrammed circuits may be implemented in any physical form including on a single substrate. Thus, it is intended that the present subject matter covers such modifications and variations as come within the scope of the appended claims and their equivalents.

The present invention covers novel approaches to the differential amplification of an input signal. Embodiments of the present invention have several advantages over prior art approaches to differential amplification. For example, embodiments of the present invention have high gain, are able to swing to within micro-volts (μV) of ground, and have very high CMRR without the need for precision resistors or tuned potentiometers. Embodiments of the present invention are particularly suited for the amplification of an instrumentation signal for delivery to an analog-to-digital converter. Examples of such signals include the product of a strain-gauge front end, a temperature sensor front end, and certain devices for bioelectronics detection.

Figure 2:
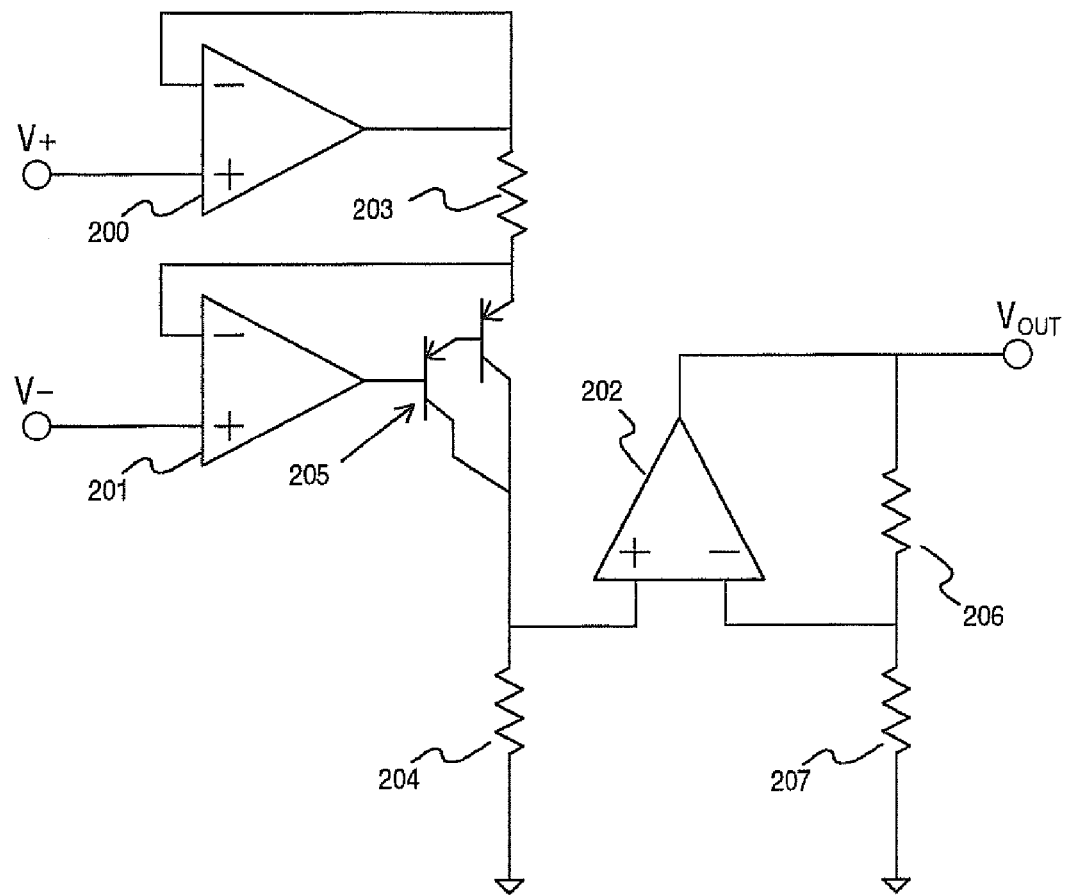
FIG. 2 illustrates a block diagram of a system for amplifying a signal that is in accordance with the present invention.

An embodiment of the present invention can be described with reference to FIG. 2. The system displayed in FIG. 2 is a single-ended differential amplifier using three operational amplifiers 200, 201, and 202. The two components of a differential input signal are received on nodes V+ and V−, and an amplified version of this differential input signal is produced in single-ended format on node $V_{OUT}$. This circuit has precise differential gain that can be a large, small, or a medium value as desired.

The differential gain of the circuit can be analyzed by breaking the circuit up into two stages. The first stage is comprised of amplifier 200, amplifier 201, resistor 203, resistor 204, and Darlington transistor 205. Darlington transistor 205 has a base terminal coupled to the output of amplifier 201, a collector terminal coupled to resistor 204, and a first-transistor emitter terminal coupled to resistor 203. Amplifier 200 and amplifier 201 are in negative feedback configuration, and therefore they will each drive their negative terminals to the input voltages on V+ and V− respectively. Such nodes can for this reason be referred to as virtual shorts. Therefore, the voltage across resistor 203 will be the difference between the input voltages and the current through resistor 203 will contain the same information as contained in the differential input signal. It is desirous to apply this signal current wholly across resistor 204 where it is converted back into a voltage for the second stage amplifier. Therefore, very little current should be lost through the base of Darlington transistor 205. Fortunately, Darlington transistors have very high Beta values which means that the ratio of the current through the base is extremely small compared to the current through the collector which provides a high impedance output terminal coupled to the positive input of amplifier 202.

Any transconductance amplifier can be used in place of Darlington transistor 205. For example, a p-type metal-oxide semiconductor (MOSFET) could be used here instead of the Darlington transistor shown in the figure. However, a Darlington transistor is preferred because the possible offsets of a MOSFET that would suffice in this situation have highly varying values. As a result, despite the most careful of design choices in selecting the size of the MOSFET, the voltage required at the output of amplifier 201 could be so low that it would be outside the linear range of operation for amplifier 201 which would cause significant errors.

Applying the assumption that the current through the collector of Darlington transistor 205 is equivalent to the current into the external emitter of the Darlington transistor, the output voltage of the first stage coupled to the positive input node of third amplifier 202 will be the product of the resistance of resistor 204, and the current through resistor 203. Therefore, the gain of the first stage is:

$$A_{DM1} = R_{204}/R_{203}$$

In the previous equation, $A_{DM1}$ is the differential gain of the first stage, and the R values are the resistance values of resistors 203, and 204 as indicated by their subscripts.

The second stage of the amplifier system illustrated in FIG. 2 is comprised of amplifier 202, resistor 206, and resistor 207. Amplifier 202 has a positive input coupled to a bias voltage through resistor 204, a negative input coupled to the bias voltage through resistor 207 and an output node coupled to node $V_{OUT}$. The second stage of this circuit is not differential. The gain of this second stage is:

$$A_2 = (R_{207} + R_{206})/R_{207}$$

In the previous equation, $A_2$ is the gain of the second stage, and the R values are the resistance values of resistor 206, and resistor 207 as indicated by their subscripts. The overall gain of the amplifier is the product of the gains of the individual stages. $A_2$ may be made higher than $A_{DM1}$, or lower than $A_{DM1}$ pursuant to various design objectives. This combined gain value describes the ratio of the differential signal at the input of the amplifier to the single-ended signal at the output of the amplifier.

Figure 3:
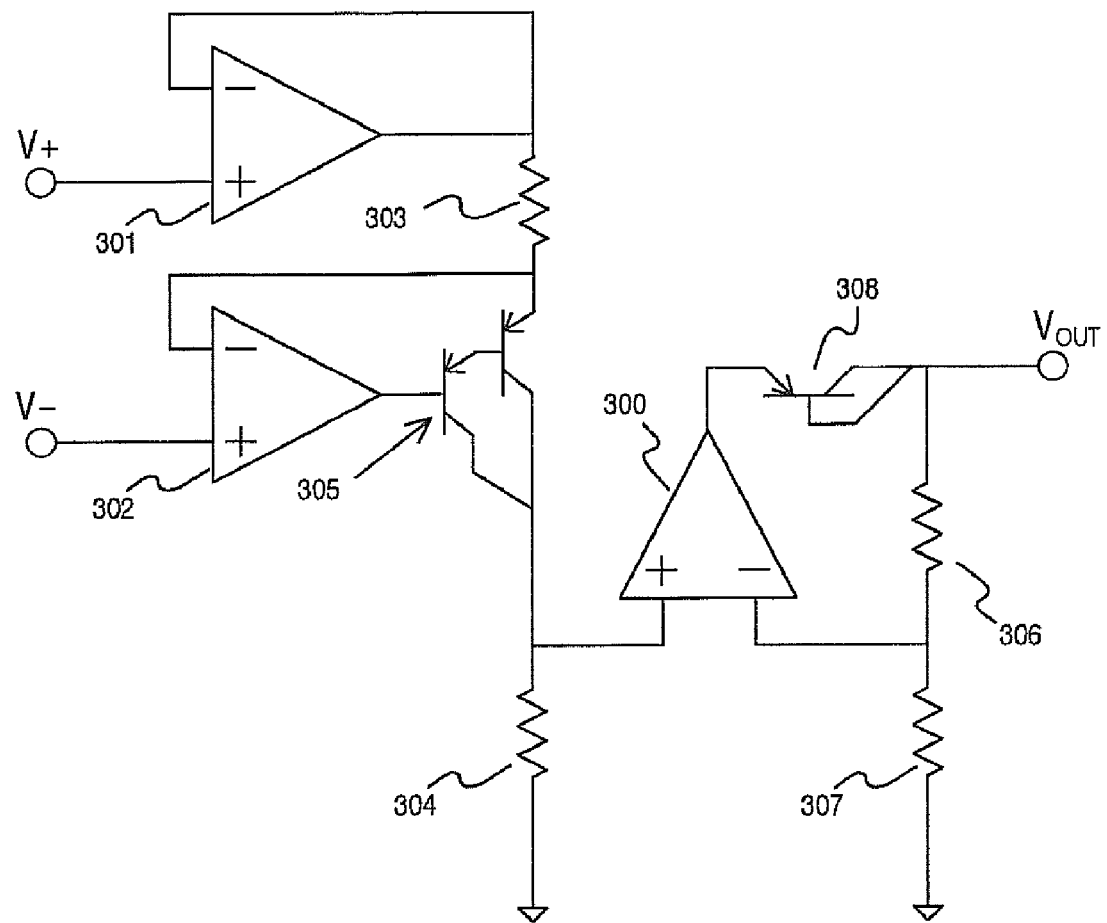
FIG. 3 illustrates a block diagram of a system for amplifying a signal with a diode coupled to the output node that is in accordance with the present invention.

Another embodiment of the present invention can be described with reference to FIG. 3. The system displayed in FIG. 3 is similar to the system shown in FIG. 2 except for the addition of a PNP bipolar junction transistor (BJT) connected to the output of amplifier 300. The system in FIG. 3 is able to swing within μV of ground.

The first stage of the system in FIG. 3 is comprised of amplifier 301, amplifier 302, resistor 303, resistor 304, and Darlington transistor 305. The second stage of the system is comprised of amplifier 300, resistor 306, resistor 307, and BJT 308. The emitter of BJT 308 is coupled to the output of amplifier 300, the base and collector of BJT 308 are coupled to node $V_{OUT}$. BJT 308 is coupled in as part of the negative feedback path of amplifier 300 along with resistor 306. BJT 308, as configured in FIG. 3, will always be forward biased while the circuit is in its regular operating mode. This is because the output of amplifier 300 will always be at a higher potential than $V_{OUT}$. BJT 308 is in diode configuration because its base is tied to its collector.

If BJT 308 is not present, the voltage at $V_{OUT}$ will not be able to swing all the way down to ground. Even if the load connected to $V_{OUT}$ is pulling zero current, $V_{OUT}$ will still be pulled up slightly by amplifier 300. Therefore, $V_{OUT}$ would remain somewhere around 20 mV. BJT 308 acts as a spacer, by limiting the output current of amplifier 300, so that the output of amplifier 300 can remain at the 20 mV level while $V_{OUT}$ is pulled down to ground. Although any diode can be used in place of BJT 308, it is advantageous to use a diode that allows a small current when it has a low forward bias voltage. BJT 308 is used as an example because transistor junctions exhibit this characteristic.

An example of the low output swing of a system in keeping with the one displayed in FIG. 3 can be analyzed by applying a PNP 2N3906 in place of BJT 308. Assuming room temperature and an amplifier output of 20 mV, the forward conduction of BJT 308 would be barely 1 pico-Amperes (pA). If resistor 306 and resistor 307 have a combined resistance of 10 kΩ, then the minimum output voltage would by 0.01 μV. Although at higher temperatures this could increase to roughly 10 μV, this is still a thousand-fold improvement over a similar circuit without the diode in place.

The combination of the two stages described above, and the addition of BJT 308 allows the output to swing down to within pV of ground, and swing up nearly as high as the supply voltage. This provides exceptional output swing and minimizes clipping. Although the first stage is somewhat limited in its maximum voltage swing, the novel approach of combining the two stages in this embodiment of the invention allows the output voltage to swing close to the supply voltage.

Figure 4:
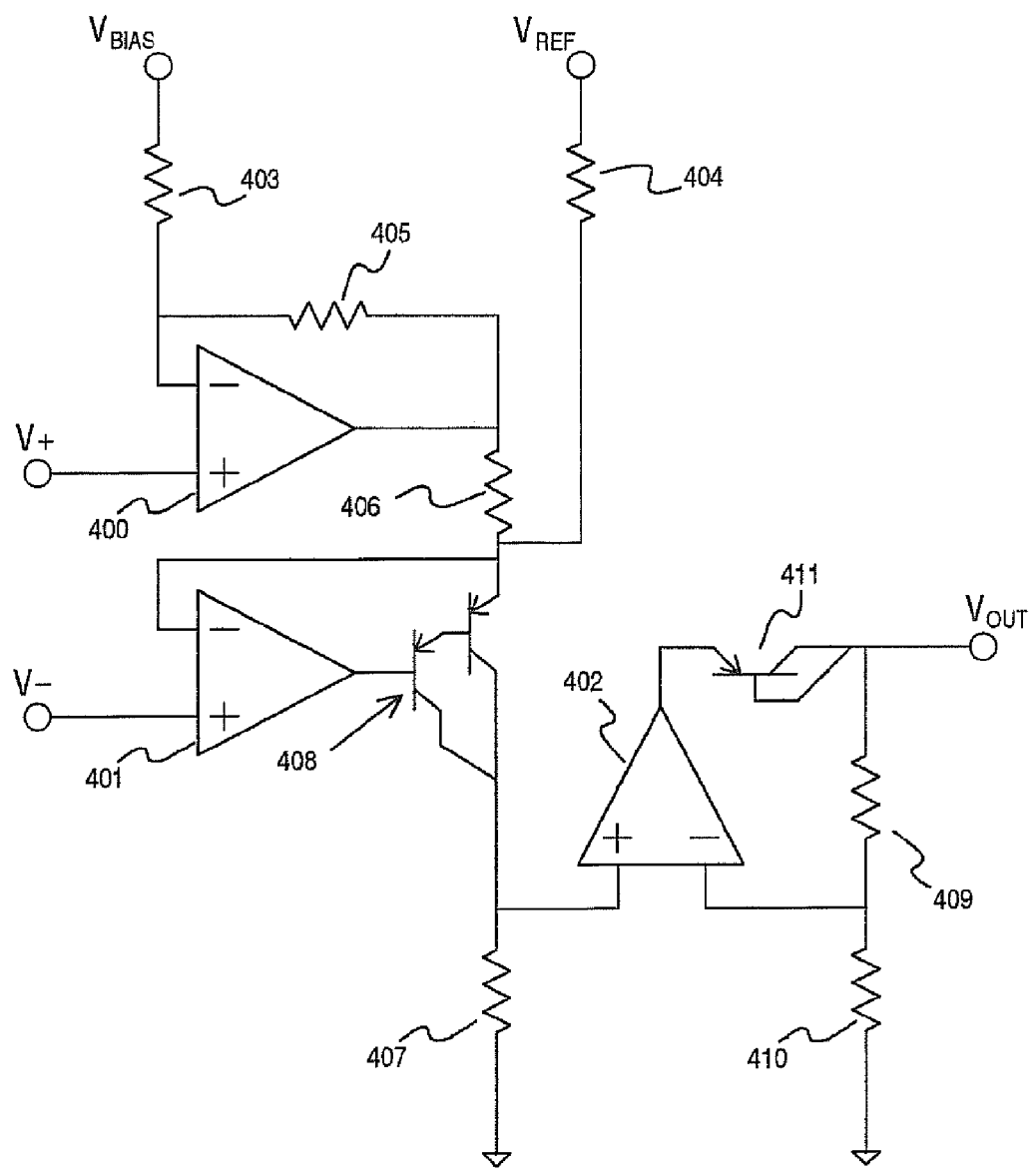
FIG. 4 illustrates a block diagram of a system for amplifying a signal with resistors coupled to bias voltages for biasing the first amplifier stage that is in accordance with the present invention.

Another specific embodiment of the invention can be described with reference to FIG. 4. The system displayed in FIG. 4 is similar to the system shown in FIG. 3 except for the addition of resistors 403 and 404, which are coupled to the bias voltages $V_{BIAS}$ and $V_{REF}$, and the addition of resistor 405. There is no change to the second stage formed by amplifier 402, BJT 411, resistor 409, and resistor 410. The system in FIG. 4 displays one approach to biasing the first stage while at the same time preserving the system's high CMRR. Note that only the first stage must be analyzed for purposes of determining the system's CMRR because the second stage in this system is single-ended and therefore cannot contribute to common mode error.

To analyze the bias current production and CMRR of the circuit in FIG. 4 it is best to begin with the approximation that amplifier 400 and amplifier 401 are ideal. As explained before, this is a fair assumption given the performance of commercially available differential amplifiers. Given this approximation, an equation displaying the relationship of the bias voltages and resistors in the first stage to the output current of the first stage with a zero input voltage signal is:

$$I_{OUT}=1/R_{406}\times[V_{CM}\times(R_{405}/R_{403}-R_{406}/R_{404})-V_{BIAS}\times R_{405}/R_{403}+V_{REF}\times R_{406}/R_{404}$$

In the prior equation $I_{OUT}$ is the current through the collector of Darlington transistor 408, $V_{CM}$ is the voltage that is common to the signals on nodes V+ and V−, the R values are the resistance values of resistors 403, 404, 405, and 406 as indicated by their subscripts, and $V_{BIAS}$ and $V_{REF}$ are the voltages at those nodes.

The purpose of $V_{BIAS}$ and $V_{REF}$ is to produce a bias current in the system. Without these voltages, a differential input of zero volts produces zero current through Darlington transistor 408. This is because amplifier 400 and amplifier 401 drive their negative terminals to the same voltage. This will in turn result in zero volts across resistors 405 and 406. In short, the first stage produces a zero output current which results in zero volts on the output across resistor 407. At first glance, this appears to be the desired state of the circuit. If V+ and V− are at the same voltage, and the first stage is an ideal differential amplifier, the output of the amplifier is zero because there is no differential input voltage. However, this is not desirable from a real world perspective because Darlington transistor 408 is not in a linear region of operation if it is passing zero current. This is unacceptable because the linear relationship of the input and output signals in an amplifier is paramount for preserving the information content of the input signal through amplification.

In a particular embodiment of the present invention, resistor 405 and resistor 406 have matching values, and resistor 403 and resistor 404 have matching values. In that case, the equation for $I_{OUT}$ presented above with a zero input voltage signal becomes:

$$I_{OUT}=(V_{BIAS}+V_{REF})/R_{404}$$

In the prior equation $I_{OUT}$ is the current through the collector of Darlington transistor 408, $R_{404}$ values is the resistance values of resistor 404, and $V_{BIAS}$ and $V_{REF}$ are the voltages at those nodes. According to this equation, a system having a $V_{REF}$ of 4 V, a $V_{BIAS}$ of 0 V, and a resistor 404 of 10 Megaohms (MΩ) will produce a bias current of 40 micro-Amperes (uA). This bias current will be sufficient to keep Darlington transistor 408 operating in the linear region, and preserve the linearity of the amplifier. The effect of the offset current can be trimmed out of the output signal. In the particular case where the output signal of the system is provided to an analog-to-digital converter, the offset can be trimmed out digitally by setting the offset voltage value equal to a digital value of zero. This method of digital calibration is far less expensive as compared to resistor trimming or the use of high precision resistors.

The bias current produced by $V_{BIAS}$ and $V_{REF}$ will remain constant as long as the resistor values and the biases themselves remain constant. It is unusual for a single resistor values to vary to an appreciable degree on a given circuit once it has been manufactured, and a deluge of techniques are known for providing stable bias voltages in the prior art. In addition, the effect of $V_{BIAS}$ and $V_{REF}$ on the output voltage is decoupled from the effect of $V_{CM}$ on the output voltage, as can be seen by their separate terms in the first $I_{OUT}$ equation presented. Therefore, even though $V_{CM}$ may change during operation due to noise or other variations, the effect of $V_{CM}$ on the output current can be analyzed separately from $V_{BIAS}$ and $V_{REF}$. On the whole, the bias current produced by $V_{BIAS}$ and $V_{REF}$ will therefore be quite stable and can easily be trimmed out of the output signal.

Although the effect of the bias current on the output signal can be trimmed out, variations in the common mode level of the input signal on V+ and V− cannot be trimmed. This is because common mode noise is not deterministic, and it will not remain constant during operation. Using the first equation for $O_{OUT}$ presented, the portion of the output current that will be effected by the errors on $V_{CM}$ that cannot be trimmed can be expressed as:

$$\Delta I_{OUT}=1/R_{406}\times\Delta V_{CM}\times(R_{405}/R_{403}-R_{406}/R_{404})$$

In the previous equation, $\Delta I_{OUT}$ is the change in the output signal current of the first stage owing to a change in the common mode input voltage $\Delta V_{CM}$, and the R values are the resistance values of resistors 403, 404, 405, and 406 as indicated by their subscripts. Note that with perfectly matched resistors the output current will be unaffected by $\Delta V_{CM}$. This would therefore result in zero common mode gain and an ideal CMRR.

Figure 1:
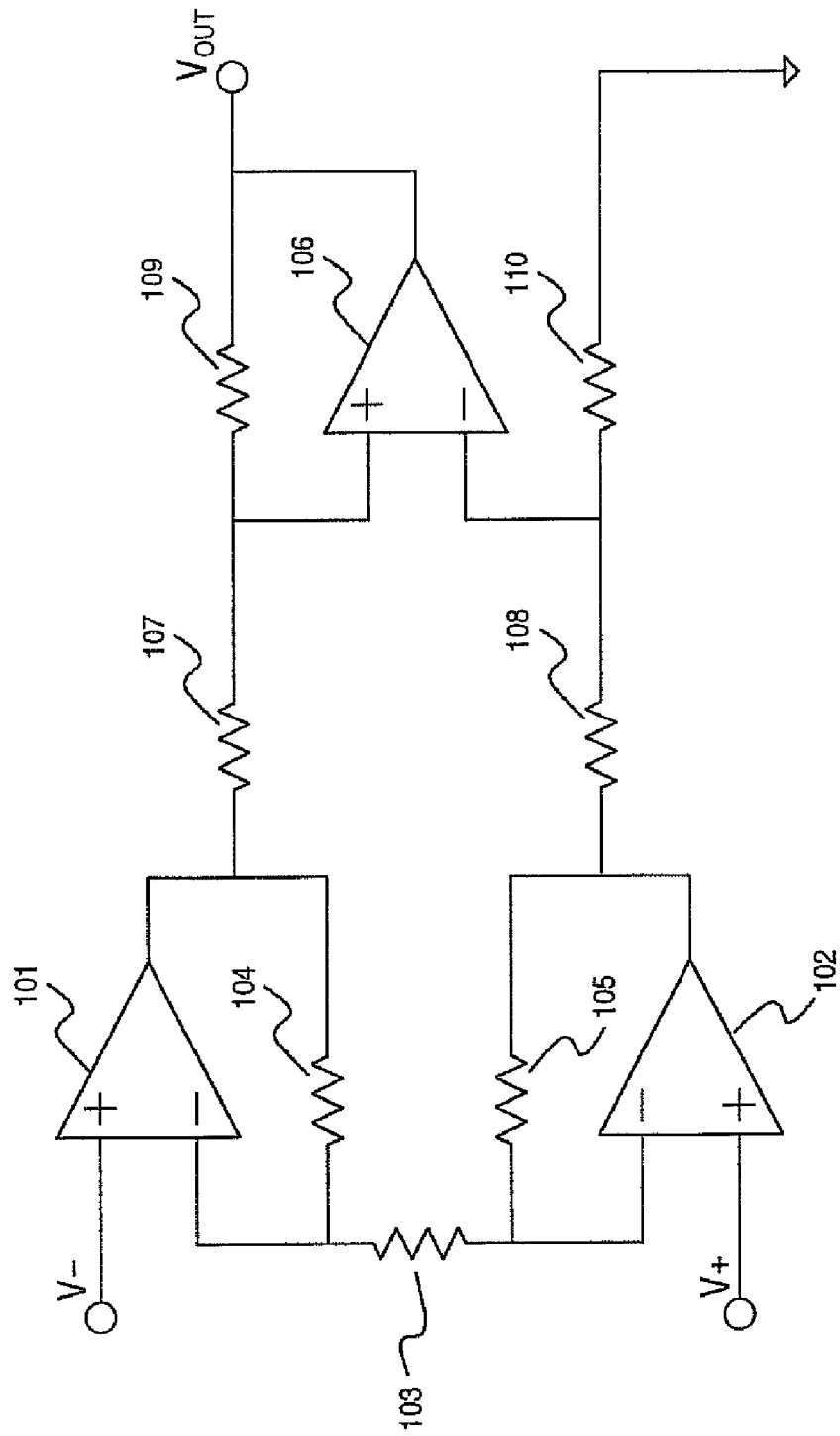
FIG. 1 illustrates a block diagram of a prior art amplifier.

If pertinent resistors in an embodiment of the invention displayed in FIG. 4 did not match, the CMRR of the circuit would still be advantageously high. Therefore, embodiments of the present invention have very high CMRR without the need for precision resistors or tunable potentiometers. In a circuit where resistor 406 and resistor 405 were designed to be 100Ω, resistor 404 and resistor 403 were designed to be 1 MΩ, resistor 407 and resistor 410 were designed to be 2 kΩ, and resistor 409 was designed to be 6 kΩ, but resistor 405 is larger by 1% due to a manufacturing error, the output signal would have roughly 160 µV of common mode output voltage for a common mode input varying from ground to 2 V. Note that this is a tremendous improvement over the prior art circuit which resulted in 20 mV of error over the same span. This embodiment of the invention therefore offers a considerable advantage as compared to the prior art circuit discussed with reference to FIG. 1.

Figure 5:
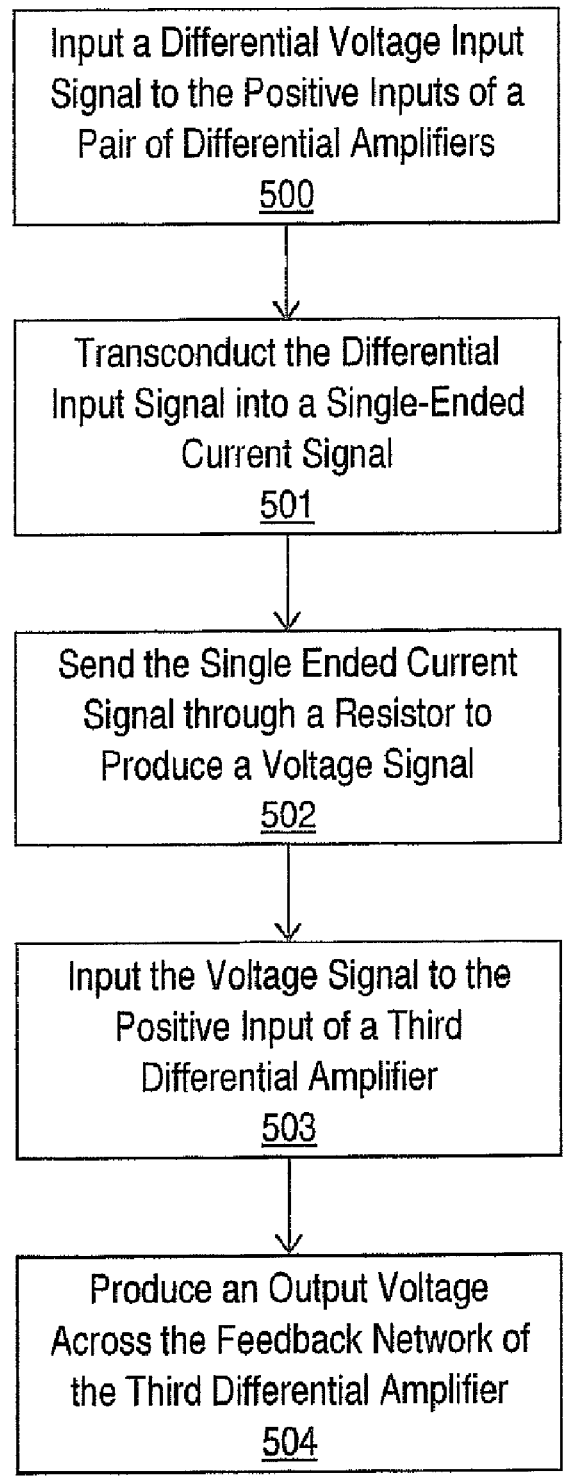
FIG. 5 illustrates a flow chart of a method for amplifying a signal that is in accordance with the present invention.

A method that is consistent with the present invention can be understood with reference to FIG. 5. In step 500, a pair of component voltage signals of a differential voltage input signal are input into the positive terminals of a first and second differential amplifiers. The differential amplifiers are in negative feedback configuration. In a particular embodiment of the invention, the first differential amplifier receives the positive voltage component of the differential input signal, and the second differential amplifier receives the negative component of the differential voltage input signal.

In step 501, a single-ended current signal carrying the information contained in the differential voltage input signal is produced through the use of a transconductance amplifier and a resistor network. The resistor network couples together the virtual short nodes of the first and second differential amplifier. The transconductance amplifier is coupled as a portion of a circuit branch that is a negative feedback path of the second differential amplifier using its two voltage input terminals. In doing so, the transconductance amplifier forms the negative feedback network of the second differential amplifier.

In steps 502, 503, and 504 this single-ended current signal is amplified to generate an output voltage signal. In step 502, the single-ended current signal is sent through a resistor and produces a single-ended voltage signal. In step 503, the single-ended voltage signal is input into the positive terminal of a third amplifier in negative feedback configuration. In step 504, the output voltage is produced as the third amplifier amplifies the single-ended voltage signal across a second resistor network that forms the negative feedback network of the third amplifier.

In another embodiment of the invention, the method described with reference to FIG. 5 additionally comprises the step of limiting the current flowing through a circuit branch from the output of the third amplifier to the second resistor network. This is accomplished by inserting a diode into the feedback circuit branch of the amplifier. If the output voltage of the amplifier is a single-ended signal with reference to a ground potential, this diode will be positioned with its anode coupled to the output of the third amplifier, and its cathode coupled to the second resistor network. In a particular embodiment of the invention, this diode will be a low-leakage diode such that the current limiting effect of this step is enhanced.

In another embodiment of the invention, the method described with reference to FIG. 5 additionally comprises the step of biasing the transconductance amplifier. In a particular embodiment of the invention, this is done by providing the transconductance amplifier with a bias current. This biasing can be accomplished by coupling a first bias voltage to the virtual short node of the first amplifier through a first resistor, and a second bias voltage to the virtual short node of the second amplifier through a second resistor. In this embodiment, the resistor network that couples the two virtual short nodes is comprised of a third resistor coupling the first virtual short node to the output of the first amplifier, and a fourth resistor coupling the output of the first amplifier to the second virtual short node. As a result, current from the output of the first amplifier is send out to a node to which both of these resistors are coupled. In order to minimize the common mode gain of the circuit, the ratio of the first resistor to the third resistor should be substantially equivalent to the ratio of the second resistor to the fourth resistor.

With reference again to FIG. 4, a particular embodiment of the invention is described. The commercially available LMP2022 operational amplifier can be used in place of both amplifier 400 and amplifier 401. These operational amplifiers have very low offsets—on the order of 5 μV—which will provide very good precision. Resistor 403 and resistor 404 can be 10 MΩ resistors, and they need not be accurately matched through expensive production or trimming processes. Resistor 405 and resistor 406 can be 100Ω resistors, and although matching is slightly more critical for these resistors, the circuit will still perform well even if they are not accurately matched. Darlington transistor 408 can be implemented using the commercially available 2N3906 BJT. This will provide better than 0.01% accuracy and good linearity for the first stage. Resistor 407 and resistor 410 can be set to 2 kΩ and resistor 409 can be set to 6 kΩ or as desired. Diode 411 can be implemented using the commercially available 2N3906 BJT. Finally, amplifier 402 can be implemented using the commercially available LMP7715 which can easily amplify the signal up to 4 V. It is also helpful to apply RC filter circuits on nodes V+, V−, $V_{BIAS}$, and $V_{REF}$ to screen noise before it can be amplified within the system.

Although the invention has been discussed primarily with respect to specific embodiments thereof, various other modifications are possible. For example, the polarity of the output signal could be switched from that described specifically and the circuit could be implemented using NPN BJT's. Likewise, the polarity of either stage could be flipped while maintaining the polarity of the other to remain as described specifically. The Darlington transistor could also be replaced by a MOSFET. The invention is also not limited to the operation of an instrumentation signal amplifier. Instead, the present invention can be applied to function in any system where the amplification of a signal is required. In addition, various methods of biasing the first stage could be applied. For example, current sources comprising active devices in voltage follower configuration could bias nodes in the first stage, or the amplifiers could supply their own output bias voltage.

Various configurations of input and output circuits may be used in place of, or in addition to, the circuit configurations presented herein. Nothing in this specification should be read to limit the invention to an embodiment where the entire system is implemented on a single system-on-chip or circuit board, an embodiment requiring wired connections, or an embodiment where the signals are propagated through the use of charged particles. The resistors mentioned in the specification could be implemented using tunable resistors, or any other form of resistive components. The transistors mentioned in the specification could be MOSFETs or any other active devices. The invention is not limited to use with silicon and can be applied to any semiconductor material including compound semiconductors. Functions may be performed by hardware or software, as desired. In general, any circuit diagrams presented are only intended to indicate one possible configuration, and many variations are possible. Those skilled in the art will also appreciate that methods and systems consistent with the present invention are suitable for use in a wide range of applications involving the amplification of signals. While the specification has been described in detail with respect to specific embodiments of the invention, it will be appreciated that those skilled in the art may readily conceive of various modifications, without departing from the spirit and scope of the present invention. Accordingly, the present invention is limited only by the following claims.

What is claimed is:

1. A system for amplification of a differential input signal comprising:
   a first resistor coupled as a portion of a circuit branch from a first virtual short to a second virtual short, said first and second virtual shorts being driven respectively by a first and a second amplifier configured for negative feedback;
   a device having a first terminal coupled to said first resistor, a second terminal coupled to an output of said second amplifier, and a high impedance output terminal passing a current substantially controlled by a difference in potential between said first and said second terminals;
   a third amplifier having a positive input coupled to a first bias voltage through a second resistor, a negative input coupled to said first bias voltage through a third resistor, and an output node; and
   a fourth resistor coupled as a portion of a negative feedback path for said third amplifier;
   wherein said differential input signal is differentially applied to a first input of said first amplifier and a second input of said second amplifier; and
   said high impedance output terminal is coupled to said positive input of said third amplifier.

2. The system from claim 1, wherein:
   said device comprises a darlington transistor;
   said first terminal comprises a first-transistor emitter terminal;

said second terminal comprises a second-transistor base terminal; and said third terminal comprises a collector terminal.

3. The system from claim 1, wherein said first bias voltage is the common ground node for said system.

4. The system from claim 3, wherein:
said device comprises a PNP type darlington transistor;
said first terminal comprises a first-transistor emitter terminal;
said second terminal comprises a second-transistor base terminal; and
said third terminal comprises a collector terminal.

5. The system from claim 1, further comprising:
a fifth resistor coupling said first virtual short to said first resistor;
a sixth resistor coupling said first virtual short to a second bias voltage; and
a seventh resistor coupling said second virtual short to a third bias voltage.

6. The system from claim 5, wherein
said second bias voltage is substantially equivalent to said first bias voltage; and said third bias voltage is a power supply node for said system.

7. The system from claim 5, wherein:
a first ratio of said first and said seventh resistor is substantially equivalent to a second ratio of said fifth and said sixth resistor; and
said sixth resistor and said seventh resistor are of much higher resistance values than said first, said second, said third, said fourth, and said fifth resistor by at least a factor of one hundred thousand.

8. The system from claim 1, further comprising:
a diode having a first diode terminal coupled to said output node of said third amplifier, and a second diode terminal coupled to said fourth resistor;
wherein said diode is forward biased when said system is in a normal operating state; and
said fourth and said third resistor, and said diode form a feedback network for said third amplifier.

9. The system from claim 8, wherein said diode is a low-leakage diode.

10. The system from claim 8, wherein said second diode terminal is coupled to a system output.

11. The system from claim 8, wherein said first bias voltage is a common ground node for said system.

12. The system from claim 11, wherein:
said diode comprises a low-leakage PNP bipolar junction transistor;
said first diode terminal comprises an emitter terminal; and
said second diode terminal comprises a base terminal of said PNP bipolar junction transistor and a collector terminal of said PNP bipolar junction transistor.

13. The system from claim 11, wherein:
said diode comprises a low-leakage PNP bipolar junction transistor;
said first diode terminal comprises a collector terminal of said PNP bipolar junction transistor; and
said second diode terminal comprises a base terminal of said low-leakage PNP bipolar junction transistor and an emitter terminal of said low-leakage PNP bipolar junction transistor.

14. A system for amplification of a differential input signal comprising:
a first amplifier having a first positive input coupled to a positive component of said differential input signal, a first output, and a first negative input;
a second amplifier having a second positive input coupled to a negative component of said differential input signal, a second output, and a second negative input;
a bias resistor coupling said first negative input to a bias voltage;
a reference resistor coupling said second negative input to a reference voltage;
a first resistor coupling said first negative input to said first output;
a second resistor coupling said first output to said second negative input;
a Darlington transistor having a first-transistor emitter coupled to said second negative input, a second-transistor base coupled to said second output, and a collector terminal;
a third amplifier having a third positive input coupled to ground through a third resistor, a third negative input coupled to ground through a fourth resistor, and a third output; and
a fifth resistor coupled as a portion of a negative feedback path for said third amplifier;
wherein said collector terminal is coupled to said third positive input.

15. The system from claim 14 further comprising:
a diode having an anode coupled to said third output and a cathode coupled to said fifth resistor;
wherein said diode, and said fifth and said fourth resistor form a feedback network for said third amplifier.

16. A method for amplifying a differential voltage input signal determined by the difference between a first voltage signal and a second voltage signal comprising the steps of:
inputting said first voltage signal to a positive terminal of a first differential amplifier in a negative feedback configuration, and said second voltage signal to a positive terminal of a second differential amplifier in a negative feedback configuration;
converting said differential voltage input signal into a single-ended intermediate current signal using a follower transconductance amplifier having voltage input terminals that form a negative feedback path of said second differential amplifier and a first resistor network that couples a first virtual short and a second virtual short of said first differential amplifier and said second differential amplifier respectively;
conducting said single-ended intermediate current signal through a first resistor to produce a single-ended voltage signal;
inputting said single-ended voltage signal to a positive terminal of a third amplifier in a negative feedback configuration; and
generating an output voltage across a second resistor network that forms a negative feedback network of said third amplifier.

17. The method from claim 16, further comprising the steps of:
biasing said follower transconductance amplifier using a second resistor being coupled to said first virtual short and a first bias voltage, and a third resistor being coupled to said second virtual short and a second bias voltage, and
sending an output current of said first amplifier to a first output node;
wherein a fourth resistor and fifth resistor form said first resistor network;
said fourth resistor couples said first virtual short to said output node;

said fifth resistor couples said second virtual short to said output node; and a ratio of said second resistor to said fourth resistor is substantially equivalent to a ratio of said third resistor to said fifth resistor.

18. The method from claim 16, further comprising the step of offsetting the output voltage of said third amplifier by inserting a diode into said negative feedback network.

19. The method from claim 18, wherein:

an cathode of said diode is coupled to said output of said third amplifier, and a anode of said diode is coupled to said second resistor network; and said diode is a low-leakage diode.

\* \* \* \* \*